(12) United States Patent
Aramaki et al.

(10) Patent No.: US 8,357,257 B2
(45) Date of Patent: Jan. 22, 2013

(54) MAGNETIC SHEET AND PRODUCTION METHOD THEREOF

(76) Inventors: Keisuke Aramaki, Kanuma (JP); Junichiro Sugita, Kanuma (JP); Morio Sekiguchi, Kanuma (JP); Katsuhiko Komuro, Kanuma (JP)

( * ) Notice: Subject to any disclaimer, the term of this patent is extended or adjusted under 35 U.S.C. 154(b) by 606 days.

(21) Appl. No.: 12/506,516

(22) Filed: Jul. 21, 2009

(65) Prior Publication Data

US 2009/0324982 A1 Dec. 31, 2009

Related U.S. Application Data

(63) Continuation of application No. PCT/JP2008/065660, filed on Sep. 1, 2008.

(30) Foreign Application Priority Data

Sep. 21, 2007 (JP) .................................. 2007-244909
Feb. 12, 2008 (JP) .................................. 2008-030805

(51) Int. Cl.
*B32B 15/02* (2006.01)
*B32B 15/04* (2006.01)
*B22F 7/02* (2006.01)

(52) U.S. Cl. .......................................... 156/245; 419/8
(58) Field of Classification Search .................... 156/245
See application file for complete search history.

(56) References Cited

U.S. PATENT DOCUMENTS

2004/0234816 A1  11/2004  Azakami
2006/0073312 A1*  4/2006  Hattori ....................... 428/195.1

FOREIGN PATENT DOCUMENTS

| JP | 11-213376 | | 8/1999 |
| JP | 2001-329234 | A1 | 11/2001 |
| JP | 2002-164688 | A1 | 6/2002 |
| JP | 2002164688 | A * | 6/2002 |
| JP | 2004-280081 | | 10/2004 |
| JP | 2005-035070 | | 2/2005 |
| JP | 2006-060008 | A1 | 3/2006 |
| JP | 2006-301900 | A1 | 11/2006 |
| JP | 2006-307209 | A1 | 11/2006 |
| JP | 2006-310575 | A1 | 11/2006 |
| JP | 2007-088335 | | 4/2007 |
| JP | 2007-123373 | A1 | 5/2007 |
| JP | 2007-165701 | A1 | 6/2007 |

OTHER PUBLICATIONS

Office Action dated Apr. 12, 2011 issued in corresponding Japanese Patent Application No. 2008-030805.

(Continued)

*Primary Examiner* — Philip Tucker
*Assistant Examiner* — Vicki Wu
(74) *Attorney, Agent, or Firm* — Kratz, Quintos & Hanson, LLP (57) ABSTRACT

A magnetic sheet, which contains: a magnetic layer including a magnetic powder and a resin composition containing the magnetic powder therein; and a convex-concave forming layer, in which the convex-concave forming layer has Bekk smoothness of 70 sec/mL or less. A method for producing a magnetic sheet, which contains: adding a magnetic powder to a resin composition to prepare a magnetic composition, and giving the magnetic composition a shape to form a magnetic layer; and placing and stacking a convex-concave forming layer and a pattern transferring material on a surface of the magnetic layer in this order, and hot pressing the stacked layers so as to bond the convex-concave forming layer with the magnetic layer to form a laminate, as well as to transfer a surface configuration of the pattern transferring material to a surface of the laminate of the convex-concave forming layer and the magnetic layer.

7 Claims, 5 Drawing Sheets

OTHER PUBLICATIONS

International Search Report for International Application No. PCT/JP2008/065660 dated Nov. 17, 2008.

Korean Office Action issued in a corresponding application mailed Mar. 28, 2011 (8 pages).

* cited by examiner

MAGNETIC SHEET AND PRODUCTION METHOD THEREOF

CROSS-REFERENCE TO RELATED APPLICATION

This is a continuation of Application No. PCT/JP2008/065660, filed on Sep. 1, 2008.

BACKGROUND OF THE INVENTION

1. Field of the Invention

The present invention relates to a magnetic sheet, which is capable of suppressing undesirable electromagnetic waves emitted from an electronic equipment, and inhibiting electromagnetic disorders caused due to the interference of the undesirable electromagnetic waves, and also relates to a production method thereof which is efficient and low cost.

2. Description of the Related Art

Along with developments of electronic equipments, e.g. personal computers and mobile phones, such as down sizing and higher frequency, these electronic equipments suffer from a noise interference due to outer electromagnetic waves and interference of noises occurred within the electronic equipment. In order to suppress such interferences, various countermeasures have been taken for the noises. For example, a magnetic sheet (noise depressing sheet) is disposed adjacent to a noise emitting source or a noise receiving source.

The magnetic sheet is formed by adding alloy (magnetic powder) such as Fe—Si—Al to an epoxy resin, acryl resin, or the like, and then being cured to formed into a sheet by hot pressing.

As a recent trend in the art, radio communication using a coil antenna in a electromagnetic induction method, which is represented as mobile information terminals having IC tags referred as Radio Frequency Identification (RFID), has been widely used. For example, in the mobile information terminal, various conductors (metals) such as a metal casing or metal parts are disposed adjacent to an antenna element for transmitting and receiving due to downsizing of the mobile information terminal. In this case, a magnetic field usable for the transmission is largely attenuated because of the metal present adjacent to the antenna element, and as a result, a distance for RFID transmission in an electromagnetic induction system may be shorten, or transmission or receiving of a radio frequency may become difficult because a resonance frequency is shifted. To prevent these electromagnetic disorders, a magnetic sheet is placed between the antenna element and the conductor.

However, there is a case where a thickness of the magnetic sheet is increased as a battery pack is expanded due to the repetitive charging. In this case, the magnetic sheet is adhered to a cover of the battery pack of the mobile phone, and it is difficult to open and close the cover.

To solve this problem, there has recently been proposed a magnetic sheet in which an insulating support is bonded to a surface of a magnetic layer with an adhesive. With this magnetic sheet, the insulating support is present in between a cover of a battery pack and a magnetic layer, and thus the insulating support exhibits lubricity performance to prevent an adhesion between the cover of the battery pack and the magnetic layer when the magnetic layer is expanded with heat, and the opening and closing failure of the cover is prevented.

For this reason, many magnetic sheets having a structure in which a magnetic layer and an insulating support are bonded to each other with an adhesive (see Japanese Patent Application Laid-Open (JP-A) Nos. 2007-165701, 2007-123373, 2006-301900, and 2001-329234).

However, as these magnetic sheets use a binder or an adhesive, a magnetic sheet (a magnetic layer) needs to be thinner by the thickness of the adhesive. Moreover, when heat is accumulated in an electronic equipment, the adhesive and the like may be bleed out inside of the electronic equipment, causing the failure of the electronic equipment.

Moreover, a magnetic sheet formed by boning a magnetic layer and an insulating support with an adhesive is produced in its production process by curing by hot pressing to form a magnetic sheet, then forming an adhesive layer on the magnetic sheet, and furthermore laminating an insulating layer on the adhesive layer. Therefore, the production process is complicated and may be resulted in high production cost.

Moreover, an insulating support is scratched by opening and closing of a cover, and appearance thereof is impaired.

Therefore, it has been strongly desired to develop an easy and simple production method of a magnetic sheet at low cost without using an adhesive, and a magnetic sheet which has an excellent surface lubricity and high magnetic permeability without an adhesive layer.

BRIEF SUMMARY OF THE INVENTION

The present invention aims at solving the problems in the art, and achieving the following objects. Namely, an object of the present invention is to provide a magnetic sheet which is capable of reducing unnecessary electromagnetic wave released from an electronic equipment, is capable of preventing electromagnetic disorders caused by an interference of unnecessary electromagnetic waves within an electronic equipment, is excellent in a surface lubricity, and has high magnetic permeability, as well as providing an easy and efficient production method thereof at low cost.

The means for solving the aforementioned problems are as follows.

<1> A magnetic sheet, containing: a magnetic layer comprising a magnetic powder and a resin composition containing the magnetic powder therein; and a convex-concave forming layer, wherein the convex-concave forming layer has Bekk smoothness of 70 sec/mL or less.

The magnetic sheet as described in <1> contains the convex-concave forming layer having low Bekk smoothness, that is 70 sec/mL or less, and thus the convex-concave forming layer has an excellent surface lubricity. Therefore, even in the case where the magnetic sheet is placed adjacent to a battery pack inside of a mobile phone, the magnetic sheet does not adhere to a cover of the battery pack and thus the opening and closing failures of the cover can be prevented. Moreover, the magnetic sheet formed with the magnetic layer and the convex-concave forming layer, without an adhesive layer formed of an adhesive or the like, and thus failures of an electronic equipment caused by the leakage of the adhesive which is caused when the magnetic sheet is used inside of the electronic equipment at a high temperature.

<2> The magnetic sheet according to <1>, wherein the magnetic layer has a thickness of 25 µm to 500 µm.

<3> The magnetic sheet according any of <1> or <2>, wherein the convex-concave forming layer has Bekk smoothness of 1 sec/mL to 60 sec/mL.

<4> A method for producing a magnetic sheet, containing: adding a magnetic powder to a resin composition so as to prepare a magnetic composition, and giving the magnetic composition a shape so as to form a magnetic layer; and placing and stacking a convex-concave forming layer and a pattern transferring material on a surface of the magnetic layer in this order, and hot pressing the stacked layers so as to bond the convex-concave forming layer with the magnetic layer to form a laminate, as well as to transfer a surface configuration of the pattern transferring material to a surface of the laminate of the convex-concave forming layer and the magnetic layer.

In accordance with the method for producing a magnetic sheet as described in <4>, in a step of the adding a magnetic powder, the magnetic powder is added to the resin composition to prepare the magnetic composition, and the magnetic composition is given a shape to form the magnetic layer. In a step of the placing and stacking, after placing and stacking the convex-concave forming layer and the pattern transferring layer on a surface of the magnetic layer in this order, the stacked layers are heat pressed so that a surface configuration of the pattern transferring material is transferred to a surface of the laminate of the convex-concave forming layer and magnetic layer as well as directly bonding the convex-concave forming layer to the magnetic layer without using an adhesive or the like. As a result, the magnetic sheet is obtained easily and efficiently at low cost.

The obtained magnetic sheet contains the convex-concave forming layer having a surface configuration which is transferred from the surface configuration of the pattern transferring material. Therefore, a surface of the convex-concave forming layer is roughened, Bekk smoothness thereof is low, and it is excellent in lubricity.

<5> The method for producing a magnetic sheet according to <4>, wherein the resin composition contains a thermoset resin, and the thermoset resin is uncured before the hot pressing.

<6> The method for producing a magnetic sheet according to any of <4> or <5>, wherein the placing and stacking further contains stacking a release layer and a pattern transferring material on the other surface of the magnetic layer in this order from the side of the magnetic layer.

<7> The method for producing a magnetic sheet according to any one of <4> to <6>, wherein the pattern transferring material has a convex-concave pattern on a surface thereof.

<8> The method for producing a magnetic sheet according to any one of <4> to <7>, wherein a surface of the convex-concave forming layer is treated with a matte processing, or a lubrication processing without using a silicone resin.

<9> The method for producing a magnetic sheet according to any one of <4> to <8>, wherein the convex-concave forming layer has Bekk smoothness of 200 sec/mL or less before the hot pressing.

<10> The method for producing a magnetic sheet according to any one of <4> to <9>, wherein the convex-concave forming layer has Bekk smoothness of 70 sec/mL or less after the hot pressing.

<11> The method for producing a magnetic sheet according to <10>, wherein the convex-concave forming layer has Bekk smoothness of 1 sec/mL to 60 sec/mL after the hot pressing.

According to the present invention, the various problems in the conventional art can be solved, and a magnetic sheet which is capable of reducing unnecessary electromagnetic wave released from an electronic equipment, is capable of preventing electromagnetic disorders caused by an interference of unnecessary electromagnetic waves within an electronic equipment, is excellent in a surface lubricity, and has high magnetic permeability, and an easy and efficient production method thereof at low cost can be provided.

DETAILED DESCRIPTION OF THE INVENTION (Magnetic Sheet)

The magnetic sheet of the present invention contains a magnetic layer and a convex-concave forming layer (i.e. convex-concave forming layer).

—Magnetic Layer—

The magnetic layer functions to decrease undesirable electromagnetic wave transmitted from an electronic equipment and suppress electromagnetic disorder caused by an interference of undesirable electromagnetic wave within an electronic equipment.

The magnetic layer contains a resin composition which contains at least a magnetic powder therein, and optionally contains arbitrarily selected other substances, as needed.

The magnetic powder is preferably contained in the magnetic layer in an amount of 60% by mass to 95% by mass.

—Resin Composition—

The resin composition is suitably selected depending on the purpose without any restriction. The resin composition preferably contains at least a thermoset resin.

The thermoset resin is suitably selected depending on the intended purpose without any restriction. The thermoset resin is preferably an epoxy resin, acryl resin, polyurethane, or carbonate urethane.

Suitable examples of the epoxy resin include an anionic curing epoxy resin using a microcapsule amine based curing agent, an cationic curing epoxy resin using an onium salt, sulfonium salt, or the like as a curing agent, and a radical curing epoxy resin using an organic peroxide as a curing agent. These may be used individually or in combination as the epoxy resin.

Examples of the acryl resin include methyl acrylate, ethyl acrylate, isopropyl acrylate, isobutyl acrylate, epoxy acrylate, ethylene glycol acrylate, diethylene glycol acrylate, trimethylol propane triacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, and urethane acrylate. These may be used individually or in combination.

Moreover, methacrylates of the aforementioned acrylate can be used, and these may be used individually or in combination.

Furthermore, these may be used together with one or more resins such as polyethylene chloride, polyurethane, polyester, polyamide, and ethylene-vinyl acetate copolymer.

—Magnetic Powder—

The magnetic powder is suitably selected depending on the purpose without any restriction. Examples of the shape of the magnetic powder include a flat, a lump, a fiber, sphere, and an irregular shape. Among them, the flat shape is preferable as the magnetic powder of such shape can be easily orientated in a predetermined direction and high magnetic permeability can be attained.

Examples of the magnetic powder include soft magnetic metal, ferrite, and pure iron particles.

Examples of the soft magnetic metal include magnetic stainless steel (i.e., Fe—Cr—Al—Si alloy), Sendust (i.e., Fe—Si—Al alloy), permalloy (i.e., Fe—Ni alloy), silicon copper (i.e., Fe—Cu—Si alloy), Fe—Si alloy, Fe—Si—B(—Cu—Nb) alloy, Fe—Ni—Cr—Si alloy, Fe—Si—Cr alloy, and Fe—Si—Al—Ni—Cr alloy.

Examples of the ferrite include: soft ferrite such as Mn—Zn ferrite, Ni—Zn ferrite, Mn—Mg ferrite, Mn ferrite, Cu—Zn ferrite, and Cu—Mg—Zn ferrite; and hard ferrite that is a permanent magnet material.

The magnetic powder may be used individually, or in combination.

—Other Substances—

The aforementioned other substances may be suitably selected from various additives known in the art depending on the purpose without any restriction, provided that these substances do not adversely affect the functions of the magnetic layer.

For the purpose of imparting fire resistance, a fire retardant may be added. Examples of the fire retardant include a zinc-based fire retardant, a nitrogen-based fire retardant, a hydroxide-based fire retardant, phosphorous-based fire retardant, and a halogen-based fire retardant. These may be used individually, or in combination.

Moreover, a dispersant, stabilizer, lubricant, coupling agent, plasticizer, antioxidant, and exothermic material may be added.

For the purpose of improving the coating ability of a magnetic composition (prepared by adding the magnetic powder to the resin composition) at the time when the magnetic layer is formed, a solvent may be added. Examples of the solvent include: ketenes such as acetone, methylethyl ketone, methylisobutyl ketone, and cyclohexanone; alcohols such as methanol, ethanol, propanol, butanol, isopropyl alcohol; esters such as methyl acetate, ethyl acetate, propyl acetate, butyl acetate, ethyl lactate, and ethyl glycol acetate; ethers such as diethylene glycol dimethyl ether, 2-ethoxy ethanol, tetrahydrofurane, and dioxane; aromatic hydrocarbon compounds such as benzen, toluene, and xylene; and halogenated hydrocarbon compounds such as methylene chloride, ethylene chloride, carbon tetrachloride, chloroform, chlorobenzene. These may be used individually or in combination.

A thickness of the magnetic layer is suitably adjusted depending on the purpose without any restriction, but it is preferably 25 µm to 500 µm as high magnetic permeability can be attained.

When the thickness is less than 25 µm, the magnetic permeability becomes low. When the thickness is more than 500 µm, such the magnetic layer is not suitable for the formation of the very small part, which does not correspond to the recent technological treads for downsized electronic equipments, and the influence the thickness gives to the magnetic permeability may become small. Note that, when the thickness is 70 µm or less, the magnetic permeability tends to be significantly lowed.

—Convex-Concave Forming Layer—

The convex-concave forming layer functions to release the magnetic sheet from a member being in contact with the magnetic sheet, for example, in an electronic equipment, when the magnetic sheet of the present invention is used.

The convex-concave forming layer has Bekk smoothness of 70 sec/mL or less, preferably 1 sec/mL to 60 sec/mL.

When Bekk smoothness of the convex-concave forming layer is 70 sec/mL or less, it is advantageous since the convex-concave forming layer has an excellent lubricity on the surface thereof, and has a significant effect on releasing the magnetic sheet from the member in contact with the magnetic sheet.

Bekk smoothness expresses the time required for a certain amount of air to pass through the surface having some irregularities of a sheet member such as paper and a cloth. Larger the degree of the irregularities on the surface of the sheet member, smaller the value of Bekk smoothness is, namely meaning excellent "lubricity".

Bekk smoothness is measured, for example, by Bekk Smoothness Tester (manufactured by TESTER SANGYO CO., LTD.).

The structure, thickness, material and the like of the convex-concave forming layer is suitably selected depending on the indented purpose without any restriction.

The structure of the convex-concave forming layer may be a monolayered structure or laminate structure.

The thickness of the convex-concave forming layer is preferably 2 µm to 100 µm.

When the thickness thereof is less than 2 µm, the usability thereof may be lowered. When the thickness thereof is more than 100 µm, heat does not transfer to the magnetic layer very easily at the time of hot pressing, and thus reliability may be lowered.

The material of the convex-concave forming layer is a synthetic resin or the like, and suitable examples of the synthetic resin include polyethylene terephthalate (PET).

The convex-concave forming layer may be selected from commercially available products, or be an arbitrarily prepared product. Examples of the commercially available products include matte processed PET (product name: LUMIRRORX 44-#25, manufacturer: Toray Industries, Inc., Bekk smoothness: 101.8 sec/mL), matte processed PET (product name: LUMIRROR44-#38, manufacturer: Toray Industries, Inc., Bekk smoothness: 83.4 sec/mL), no-lubrication processed PET (product name: Emblet, manufacturer: UNITIKA LTD., Bekk smoothness: more than 200 sec/mL), non-silicone lubrication processed PET (product name: FLUOROJU RL, manufacturer: Mitsubishi Plastics, Inc., Bekk smoothness: more than 200 sec/mL), and silicone-lubrication processed PET (product name: 25GS, manufacturer: LINTEC Corporation, Bekk smoothness: more than 200 sec/mL). On the convex-concave forming layer, characters may be printed. The surface of the convex-concave forming layer on which the characters are printed may be a surface (opposite surface) where is in contact with the magnetic layer, or a surface where is not in contact with the magnetic layer.

—Application—

The application of the magnetic sheet of the present invention is suitably selected depending on the intended purpose without any restriction. For example, the magnetic sheet may be cut into a desirable size, and disposed in an electronic equipment so that the magnetic layer side of the magnetic sheet is placed adjacent to a nozzle source of the electronic equipment.

—Use—

The magnetic sheet of the present invention can be suitably used for electromagnetic noise depressors, electromagnetic wave absorbers, magnetic shielding, electronic equipments having IC tag functions such as RFID (e.g. RFID functioned mobile phones), and non-contact IC cards.

Since the magnetic sheet of the present invention contains the convex-concave forming layer, it is suitably used when a high insulating property is required, or when it is used in the design (a narrow portion) such that the magnetic sheet is disposed to be in contact with another electronic part. Note that, the magnetic powder contained in the magnetic layer is metal, and thus the surface resistance of the magnetic layer is low such as 0.01 MΩ/sq to 1 MΩ/sq, even though the magnetic powder is mixed with the resin composition. In the case where a flame retardant is added thereto, the surface resistance is further lowered, and thus the magnetic sheet having a flame retardance preferably has the convex-concave forming layer.

The presence of the convex-concave forming layer helps to prevent the metal powder from falling off from the surface of the magnetic layer. Moreover, the convex-concave forming layer is bonded to one surface of the magnetic layer and thus the moisture absorption area of the magnetic layer is reduced, and thus the reliability is improved.

Moreover, the convex-concave forming layer has a convex-concave pattern on a surface thereof, is excellent in lubricity, and thus is suitably used in a battery pack portion of a mobile phone. In this case, even when the battery pack is expanded by the heat of a lithium battery as a result of the repetitive charging, the convex-concave forming layer prevents the adhesion with the battery pack and thus the opening and/or closing failures of the cover of the battery pack is prevented.

In the case where a convex-concave pattern is not transferred to the surface of the convex-concave forming layer, scratches are formed on the surface thereof as a result of the opening and closing of the cover of the battery pack, and thus the appearance is impaired. The formation of the convex-concave pattern on the convex-concave forming layer by the convex-concave pattern transfer has an advantage such that scratch marks are not formed on the convex-concave forming layer.

Since the magnetic sheet of the present invention has the convex-concave forming layer having Bekk smoothness of 70 sec/mL or less, the surface lubricity of the convex-concave forming layer is excellent.

Moreover, unlike to the conventional magnetic sheet, the magnetic sheet of the present invention does not contain an adhesive layer. Because of this, failures of an electronic equipment due to the leakage of the adhesive, which is caused when the magnetic sheet containing the adhesive layer is used in the electronic equipment at high temperature, can be prevented. Moreover, as the magnetic sheet of the present invention can thicken the magnetic layer by the thickness of the adhesive layer compared to the conventional magnetic sheet, the magnetic sheet of the present invention has a large specific gravity and high magnetic permeability.

A production method for the magnetic sheet of the present invention is suitably selected depending on the intended purpose without any restriction, but it is suitably produced by the method for producing a magnetic sheet of the present invention, which will be described as follow.

(Method for Producing Magnetic Sheet)

The method for producing a magnetic sheet of the present invention contains at least a magnetic layer forming step, and a pattern transferring step, and optionally contains arbitrarily selected other steps, if necessary.

<Magnetic Layer Forming Step>

The magnetic layer forming step is adding a magnetic powder to a resin composition so as to prepare a magnetic composition, and giving the magnetic composition a shape so as to form a magnetic layer.

The details of the resin composition and the magnetic powder are as described earlier, but the resin composition preferably contains at least the thermoset resin and is uncured before hot pressing described later. If it starts curing before hot pressing, the magnetic layer is not sufficiently compressed, and magnetic permeability thereof cannot be made large. Moreover, if the cured magnetic layer is compressed, a strain is remained, a thickness of the magnetic layer may be thickened in the thickness direction or magnetic properties thereof may be lowered when it is repeatedly exposed to the environment of the room temperature, high temperature, and/or high temperature and high humidity. In contrast, if the resin composition is uncured before heat pressing, these problems are prevented.

The magnetic composition is prepared by adding the magnetic powder to the resin composition and mixing the resulted mixture.

The shaping of the magnetic composition is performed, for example, by applying the magnetic composition on a substrate, and drying the magnetic composition.

The substrate is suitably selected depending on the intended purpose without any restriction, but it is preferably a polyester film a surface of which is lubrication processed (lubrication processed PET) as the formed magnetic layer can be easily peeled from the substrate.

Moreover, as the substrate, a matte PET, a PET which is not lubrication processed, a non-silicone lubrication processed PET (whose surface where a magnetic layer is formed is not lubrication processed), or a silicone lubrication processed PET (whose surface where a magnetic layer is formed is not lubrication processed) may be also used.

By the step mentioned above, the magnetic composition is given a shape to form the magnetic layer.

<Pattern Transferring Step>

The pattern transferring step is placing and stacking a convex-concave forming layer and a pattern transferring material on a surface of the magnetic layer in this order, and hot pressing the stacked layers so as to bond the convex-concave forming layer with the magnetic layer to form a laminate, as well as to transfer a surface configuration of the pattern transferring material to a surface of the laminate of the convex-concave forming layer and the magnetic layer.

—Convex-Concave Forming Layer—

The structure, thickness, and material of the convex-concave forming layer is suitably selected depending on the intended purpose without any restriction. The details thereof are as mentioned earlier in the descriptions of the convex-concave forming layer.

The surface configuration of the convex-concave forming layer is not particularly limited, and one surface thereof may be surface-treated, or no surface treatment may be performed. As a surface treatment, a matte processing, lubrication processing without using a silicone resin and the like are preferable. In the case a surface thereof is treated with any of the aforementioned processings, a lubricity of the surface is improved compared to the surface without any surface treatment. Moreover, in these processings of the surface treatment, as the silicone resin is not used, silicone oligomers do not bleed out under the condition of high temperature and/or high humidity, and thus it is suitably used inside of an electronic equipment.

The matte processing is suitably selected depending on the intended purpose without any restriction. Examples thereof include a sand matte processing, chemical matte processing, surface emboss processing and the like. By these processing, the convex-concave pattern is formed on the convex-concave forming layer and as a result, a lubricity thereof is improved.

The convex-concave forming layer preferably has Bekk smoothness of 200 sec/mL before hot pressing.

When Bekk smoothness thereof is more than 200 sec/mL before hot pressing, it adversely affect Bekk smoothness after hot pressing.

Note that, the details of Bekk smoothness are as mentioned earlier.

—Pattern Transferring Material—

The structure, thickness and material of the pattern transferring material is suitably selected depending on the intended purpose without any restriction. For example, those having a convex-concave pattern on the surface thereof and excellent air permeability are preferable. In this case, once the convex-concave pattern convex-concave forming layer on the surface of the pattern transferring material is transferred to the convex-concave forming layer, the convex-concave pattern is formed on the surface of the convex-concave forming layer, and as a result, Bekk smoothness of the convex-concave forming layer is lowered and lubricity of the convex-concave forming layer is improved.

The surface irregularities of the pattern transferring material can be evaluated by the value of Bekk smoothness. The smaller the value of Bekk smoothness is the larger the irregularities are.

The structure of the pattern transferring material may be a monolayered structure or laminate structure.

The thickness of the pattern transferring material is preferably 25 µm to 200 µm.

When the thickness thereof is less than 25 µm, it may not be able to attain a magnetic sheet of low Bekk smoothness. When the thickness thereof is more than 200 µm, heat does not easily transfer to the magnetic layer at the time of hot pressing, and thus the reliability may be lowered.

The material of the pattern transferring material is, for example, paper, synthetic fibers, or natural fibers.

The pattern transferring material may be a commercially available product or arbitrarily prepared product. Examples of the commercially available product include a high quality paper (product name: OK Prince High Quality 70, manufacturer: Oji Paper Co., Ltd., Bekk smoothness: 6.2 sec/mL), a cushioned paper (product name: TF190, manufacturer: THE TOYO FIBRE CO., LTD., Bekk smoothness: 1.7 sec/mL), nylon mesh (product name: N—No. 110S, manufacturer: TOKYO SCREEN CO., LTD., Bekk smoothness: less than 0.1 sec/mL), cotton cloth (product name: Kanakin No. 3, manufacturer: Japanese Standards Association, Bekk smoothness: less than 0.1 sec/mL), a base paper for an adhesive (product name: SO base paper 18G, manufacturer: DAIFUKU PAPER MFG CO., LTD., Bekk smoothness: less than 0.1 sec/mL), a double sided release paper (product name: 100GVW (High lubricity surfaces), manufacturer: Oji Paper Co., Ltd., Bekk smoothness: 146 sec/mL), and a double sided release paper (product name: 100GVW (Low lubricity surfaces), manufacturer: Oji Paper Co., Ltd., Bekk smoothness: 66 sec/mL).

—Arrangement of Stacked Layers—

The method for an arrangement of stacked layers is suitably selected depending on the purpose without any restriction, provided that the convex-concave forming layer and the pattern transferring material are stacked on at least one surface of the magnetic layer in this order. It is preferred that a release layer and the pattern transferring material are further stacked on the other surface of the magnetic layer in this order. As the pattern transferring material are stacked on the other surface of the magnetic layer with the release layer being placed in between, the other surface of the magnetic layer is protected and prevented from closely attaching to the pattern transferring material at the time of hot pressing mentioned later, and the pattern transferring layer is easily peeled from the magnetic layer along with the release layer after hot pressing. Moreover, the surface configuration of the pattern transferring material is transfer to the surface of the magnetic layer which is present at the side of the releasing layer, and at this time, air bubbles present in the resin composition of the magnetic layer are easily released, and thus the reliability of the obtained magnetic sheet is improved. In the case where the pattern transferring material is not used at the side of the release layer, magnetic permeability of the magnetic sheet is improved.

The release layer is suitably selected depending on the intended purpose without any restriction, provided that it functions to prevent the close attachment between the other surface of the magnetic layer and the pattern transferring material at the time of hot pressing. The release layer is preferably a polyester film a surface of which is lubrication processed (lubrication processed PET), as it is easily peeled from the magnetic layer after hot pressing.

—Hot Press—

The method for hot pressing is suitably selected depending on the intended purpose without any restriction. For example, it is performed by sandwiching stacked layers of the magnetic layer, the convex-concave forming layer and the pattern transferring layer with a laminator or press the stacked layers from the both sides thereof, then heating and pressing the same.

As a result of hot pressing, the surface configuration (convex-concave pattern) of the pattern transferring material is transferred to surfaces of the convex-concave forming layer and magnetic layer, and also the convex-concave forming layer and the magnetic layer are directly bonded to each other without using an adhesive or the like.

The conditions for hot pressing are suitably adjusted depending on the intended purpose without any restriction. For example, the temperature is preferably 80° C. to 190° C., the pressure is preferably 5 MPa to 20 MPa, and the duration is preferably 1 minute to 20 minutes.

Bekk smoothness of the convex-concave forming layer after hot pressing is preferably 70 sec/mL or less, more preferably 1 sec/mL to 60 sec/mL.

When Bekk smoothness thereof is more than 70 sec/mL, the surface lubricity of the convex-concave forming layer may be insufficient, and as a result, the magnetic sheet and a member which is brought into contact with the magnetic sheet may be adhered.

According to the aforementioned step, the surface configuration of the pattern transferring material is transferred to the surfaces of the convex-concave forming layer and magnetic layer at the same time as the convex-concave forming layer and the magnetic layer are bonded to each other. As a result, a magnetic sheet containing the magnetic layer and the convex-concave forming layer is obtained.

The magnetic sheet obtained in the aforementioned manner has the convex-concave forming layer a surface of which has the surface configuration transferred from the surface configuration (convex-concave surface pattern) of the pattern transferring material and is roughened, and thus Bekk smoothness thereof is low and the lubricity thereof is excellent.

According to the method for producing the magnetic sheet of the present invention, a surface configuration of the pattern transferring material is transferred to surfaces of the convex-concave forming layer and magnetic layer by hot pressing, and thus a surface of the convex-concave forming layer is roughened, Bekk smoothness thereof is reduced, and the lubricity is improved.

Therefore, Bekk smoothness of the convex-concave forming layer can be suitably controlled in the desirable range regardless of the original value of Bekk smoothness of the convex-concave forming layer, and thus the selection of the material used for the convex-concave forming layer is widened. In addition, the control of Bekk smoothness can be performed easily.

Moreover, as the convex-concave forming layer and the magnetic layer are directly bonded to each other by hot pressing, an adhesive layer is unnecessary, and thus a magnetic sheet can be easily and efficiently produced at low cost.

The examples of the present invention will be explained hereinafter, but these examples shall not be construed as limiting the scope of the present invention.

EXAMPLE 1

—Preparation of Magnetic Sheet—

At first, in 270 parts by mass of toluene and 120 parts by mass of ethyl acetate, 83 parts by mass of acryl rubber having epoxy groups (SG80H-3, manufactured by Nagase ChemteX Corporation), 23 parts by mass of epoxy resin (EPICOAT (now named as jER®) 1031S, manufactured by Japan Exposy Resins Co., Ltd.), and 6.9 parts by mass of an epoxy curing agent (HX3748, manufactured by Asahi Kasei Chemicals Corporation) were dissolved so as to prepare a resin composition. To the resin composition, 550 parts by mass of flat magnetic powder (SP-1, manufactured by MATE CO., LTD.) as the magnetic powder, and the obtained mixture was mixed so as to prepare a magnetic composition.

The thus obtained magnetic composition was applied onto a polyester film a surface of which had been lubrication treated (a release PET; corresponds to a release layer 22 mentioned later) as the base, and dried at the temperature ranging from a room temperature to 115° C. to thereby form a magnetic layer 10. The processes described above were corresponded to the magnetic layer forming step.

Figure 1A:
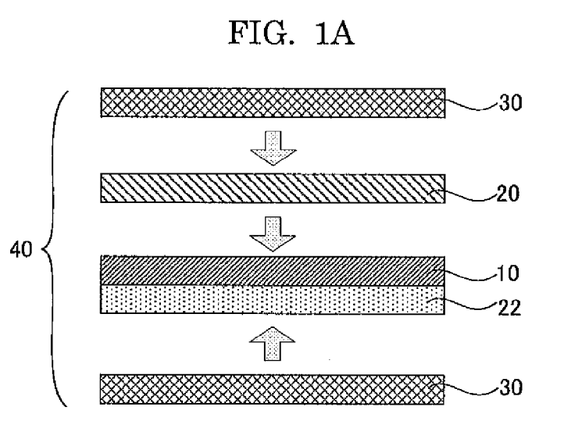
FIG. 1A is a process diagram (part 1) showing an example of the method for producing a magnetic sheet of the present invention.

Next, a polyester film a surface of which had been matte processed (matte processed PET) (product name: LUMIRRORX 44-#25, manufacturer: Toray Industries, Inc., thickness: 25 μm, Bekk smoothness: 101.8 sec/mL) as a convex-concave forming layer 20, and high quality paper (product name: OK Prince High Quality 70, manufacturer: Oji Paper Co., Ltd., thickness: 100 μm, Bekk smoothness: 6.2 sec/mL) as a pattern transferring material 30 were stacked in this order on the surface of the magnetic layer 10 where the release PET (release layer 22) was not present as shown in FIG. 1A.

On the other surface of the magnetic layer 10, a pattern transferring material 30 was stacked via the release layer 22 (release PET) (product name: 38GS, manufacturer: LINTEC Corporation, thickness: 38 μm), which had been already stacked as the base, so as to form a stacked body (stacked layers) 40.

Figure 1B:
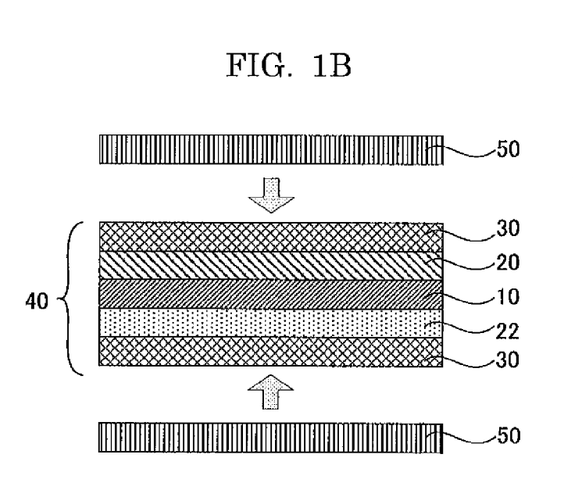
FIG. 1B is a process diagram (part 2) showing the example of the method for producing a magnetic sheet of the present invention.

Thereafter, the stacked body 40 was subjected to hot pressing using a vacuum press (manufactured by KITAGAWA SEIKI CO., LTD.) at temperature of 170° C., and pressure of 9 MPa, for 10 minutes, by sandwiching the stacked body 40 from both sides thereof with press plates 50 as shown in FIG. 1B so as to form the magnetic layer 10 having a thickness of 75 μm. As a result, the convex-concave forming layer 20 and the magnetic layer 10 were bonded, and at the same time, the surface configuration of the pattern transferring material 30 was transferred to a surface of a laminate of the convex-concave forming layer 20 and the magnetic layer 10. The processes mentioned above were corresponded to the pattern transferring step.

The stacked body 40 which had been hot-pressed was cut into a sample size of 250 mm×250 mm.

Figure 1C:
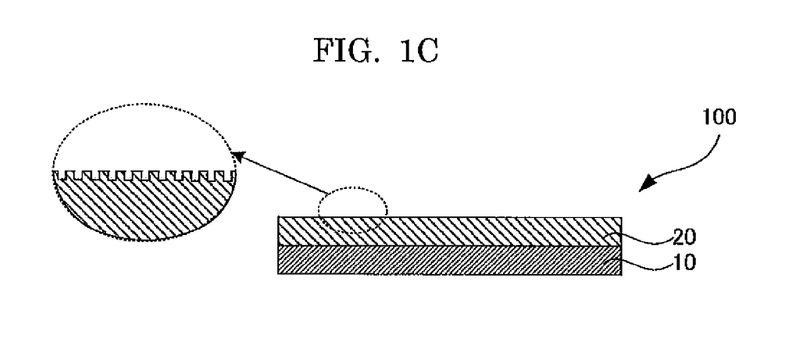
FIG. 1C is a process diagram (part 3) showing the example of the method for producing a magnetic sheet of the present invention, and illustrates an example of the obtained magnetic sheet (the present invention).

Then, as shown in FIG. 1C, the pattern transferring material 30 and the release layer 22 were respectively peeled from the convex-concave forming layer 20 and the magnetic layer 10 to thereby obtain a magnetic sheet 100 having a thickness of 100 μm.

EXAMPLE 2

—Preparation of Magnetic Sheet—

A magnetic sheet was prepared in the same manner as in Example 1, provided that the convex-concave forming layer 20 used in Example 1 was replaced with a polyester film a surface of which had been matte processed shown in Table 1.

EXAMPLE 3

—Preparation of Magnetic Sheet—

A magnetic sheet was prepared in the same manner as in Example 1, provided that the convex-concave forming layer 20 used in Example 1 was replaced with a polyester film which had not been lubrication processed shown in Table 1.

EXAMPLE 4

—Preparation of Magnetic Sheet—

A magnetic sheet was prepared in the same manner as in Example 1, provided that the convex-concave forming layer 20 used in Example 1 was replaced with a polyester film a surface of which had been lubrication processed without using a silicone resin shown in Table 1.

EXAMPLE 5

—Preparation of Magnetic Sheet—

A magnetic sheet was prepared in the same manner as in Example 1, provided that the convex-concave forming layer 20 used in Example 1 was replaced with a polyester film a surface of which had been lubrication processed with a silicone resin shown in Table 1.

EXAMPLE 6

—Preparation of Magnetic Sheet—

A magnetic sheet was prepared in the same manner as in Example 1, provided that the flat magnetic powder (SP-1, manufactured by MATE CO., LTD.) used as the magnetic powder in Example 1 was replaced with flat magnetic powder (EMS-12, manufactured by Mitsubishi Materials Electronic Chemicals Co., Ltd.), and a thickness of the magnetic layer 10 was changed to 100 μm.

EXAMPLE 7

—Preparation of Magnetic Sheet—

A magnetic sheet was prepared in the same manner as in Example 1, provided that the flat magnetic powder (SP-1, manufactured by MATE CO., LTD.) used as the magnetic powder in Example 1 was replaced with flat magnetic powder (EMS-12, manufactured by Mitsubishi Materials Electronic Chemicals Co., Ltd.), and a thickness of the magnetic layer 10 was changed to 200 μm.

EXAMPLE 8

—Preparation of Magnetic Sheet—

A magnetic sheet was prepared in the same manner as in Example 1, provided that the flat magnetic powder (SP-1, manufactured by MATE CO., LTD.) used as the magnetic powder in Example 1 was replaced with flat magnetic powder (EMS-12, manufactured by Mitsubishi Materials Electronic Chemicals Co., Ltd.), and a thickness of the magnetic layer 10 was changed to 300 μm.

EXAMPLE 9

—Preparation of Magnetic Sheet—

A magnetic sheet was prepared in the same manner as in Example 1, provided that the flat magnetic powder (SP-1, manufactured by MATE CO., LTD.) used as the magnetic powder in Example 1 was replaced with flat magnetic powder (EMS-12, manufactured by Mitsubishi Materials Electronic Chemicals Co., Ltd.), and a thickness of the magnetic layer 10 was changed to 500 μm.

EXAMPLE 10

—Preparation of Magnetic Sheet—

A magnetic sheet was prepared in the same manner as in Example 1, provided that the flat magnetic powder (SP-1, manufactured by MATE CO., LTD.) used as the magnetic powder in Example 1 was replaced with flat magnetic powder (JEM-S, manufactured by Mitsubishi Materials Electronic Chemicals Co., Ltd.), a thickness of the magnetic layer was changed to 100 μm, the matte processed PET (LUMIRROR× 44 #25) as the convex-concave forming layer 20 was replaced with a polyester film which had not been lubrication processed in Table 1, and the temperature for hot pressing was changed from 170° C. to 150° C.

EXAMPLE 11

—Preparation of Magnetic Sheet—

A magnetic layer was prepared in the same manner as in Example 1, provided that the flat magnetic powder (SP-1, manufactured by MATE CO., LTD.) used as the magnetic powder in Example 1 was replaced with flat magnetic powder (EMS-12, manufactured by Mitsubishi Materials Electronic Chemicals Co., Ltd.), a thickness of the magnetic layer was changed to 100 μm, and the matte processed PET (LUMIR-ROR×44 #25) as the convex-concave forming layer 20 was replaced with a polyester film which had not been lubrication processed in Table 1.

EXAMPLE 12

—Preparation of Magnetic Sheet—

A magnetic layer was prepared in the same manner as in Example 1, provided that the flat magnetic powder (SP-1, manufactured by MATE CO., LTD.) used as the magnetic powder in Example 1 was replaced with flat magnetic powder (EMS-12, manufactured by Mitsubishi Materials Electronic Chemicals Co., Ltd.), a thickness of the magnetic layer was changed to 100 μm, and the matte processed PET (LUMIR-ROR×44 #25) as the convex-concave forming layer 20 was replaced with a polyester film which had not been lubrication processed in Table 1.

EXAMPLE 13

—Preparation of Magnetic Sheet—

To 270 parts by mass of toluene and 120 parts by mass of ethyl acetate, 83 parts by mass of acryl rubber having epoxy groups (SG80H-3, manufactured by Nagase ChemteX Corporation), 23 parts by mass of epoxy resin (EPICOAT (jER®) 1031S, manufactured by Japan Exposy Resins Co., Ltd.), and 6.9 parts by mass of epoxy curing agent (HX3748, manufactured by Asahi Kasei Chemicals Corporation) were dissolved so as to prepare a resin composition. To the resin composition, 550 parts by mass of flat magnetic powder (EMS-12, manufactured by Mitsubishi Materials Electronic Chemicals Co., Ltd.) was added as the magnetic powder, and the mixture was mixed so as to prepare a magnetic composition.

The thus obtained magnetic composition was applied to a polyester film a surface of which had been matte processed (matte processed PET) (product name: LUMIRRORX44-#25, manufacturer: Toray Industries, Inc., thickness: 25 μm, Bekk smoothness: 101.8 sec/mL) (corresponded to the convex-concave forming layer 20 mentioned later), and dried at the temperature ranging from a room temperature to 115° C., to thereby form a magnetic layer. The processes mentioned above were corresponded to the magnetic layer forming step.

Figure 2A:
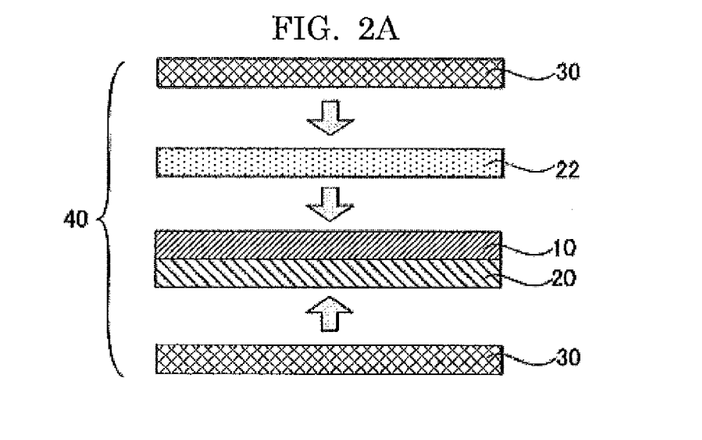
FIG. 2A is a process diagram (part 1) showing an example (Example 13) of the method for producing a magnetic sheet of the present invention.

Next, a lubrication processed PET (product name: 38GS, manufacturer: LINTEC Corporation, thickness: 38 μm) as a release layer 22, and a high quality paper (product name: OK Prince High Quality 70, manufacturer: Oji Paper Co., Ltd., thickness: 100 μm, Bekk smoothness: 6.2 sec/mL) as a pattern transferring material 30 were stacked in this order on the surface of the magnetic layer 10 where the pattern transferring layer 20 was not present as shown in FIG. 2A. Here, the release layer 22 was stacked in the manner that the lubrication processed surface of the release layer 22 faced to the magnetic layer 10.

On the other surface of the magnetic layer 10, a pattern transferring material 30 was stacked via the convex-concave forming layer 20 (matte processed PET) (product name: LUMIRRORX44-#25, manufacturer: Toray Industries, Inc., thickness: 25 μm, Bekk smoothness: 101.8 sec/mL), which had been already stacked, so as to form a stacked body (stacked layers) 40.

Figure 2B:
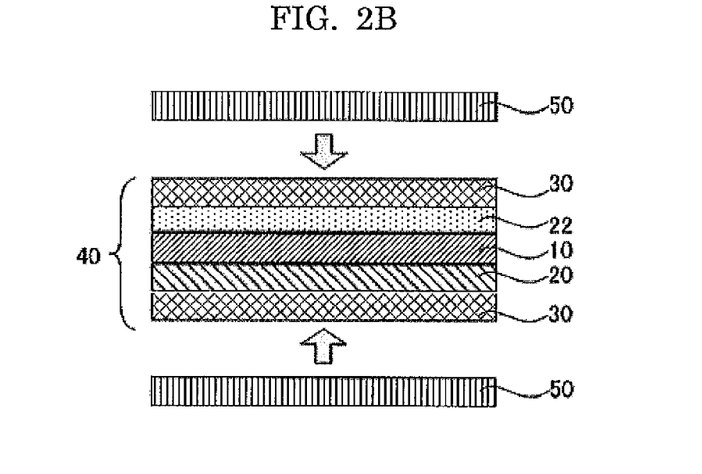
FIG. 2B is a process diagram (part 2) showing the example (Example 13) of the method for producing a magnetic sheet of the present invention.

Thereafter, the stacked body 40 was subjected to hot pressing using a vacuum press (manufactured by KITAGAWA SEIKI CO., LTD.) at temperature of 170° C., and pressure of 9 MPa, for 10 minutes, by sandwiching the stacked body 40 from both sides thereof with press plates 50 as shown in FIG.

2B so as to form the magnetic layer having a thickness of 100 µm. As a result, the convex-concave forming layer 20 and the magnetic layer 10 were bonded, and at the same time, the surface configuration of the pattern transferring material 30 was transferred to a surface of the laminate of the convex-concave forming layer 20 and the magnetic layer 10. The processes mentioned above were corresponded to the pattern transferring step.

The stacked body 40 which had been hot-pressed was cut into a sample size of 250 mm×250 mm.

Figure 2C:
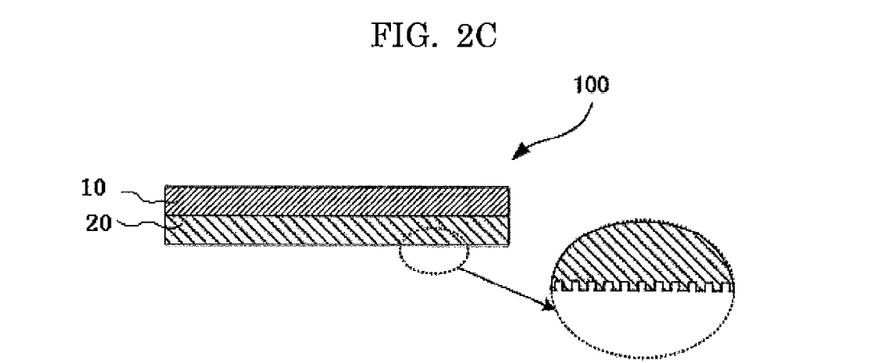
FIG. 2C is a process diagram (part 3) showing the example (Example 13) of the method for producing a magnetic sheet of the present invention, and illustrates an example of the obtained magnetic sheet (the present invention).

Then, as shown in FIG. 2C, the pattern transferring material 30 and the release layer 22 were respectively peeled from the convex-concave forming layer 20 and the magnetic layer 10 to thereby obtain a magnetic sheet 100.

EXAMPLE 14

Figure 3A:
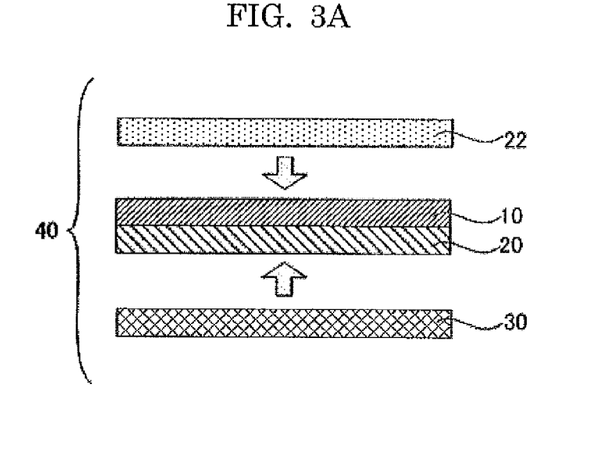
FIG. 3A is a process diagram (part 1) showing an example (Example 14) of the method for producing a magnetic sheet of the present invention.
Figure 3B:
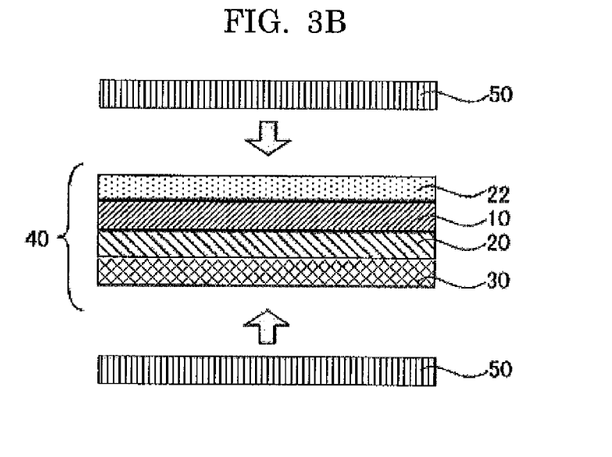
FIG. 3B is a process diagram (part 2) showing the example (Example 14) of the method for producing a magnetic sheet of the present invention.
Figure 3C:
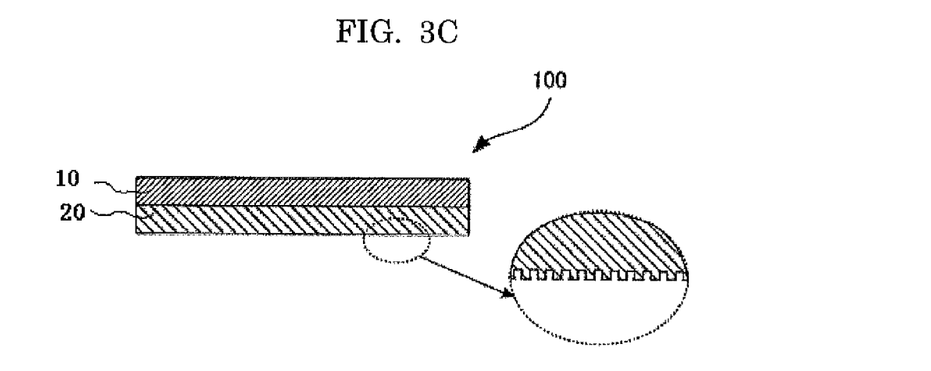
FIG. 3C is a process diagram (part 3) showing the example (Example 14) of the method for producing a magnetic sheet of the present invention, and illustrates an example of the obtained magnetic sheet (the present invention).

A magnetic sheet was prepared in the same manner as in Example 13, provided that the arrangement of the stacked layers was changed in the manner that only a lubrication processed PET (product name: 38GS, manufacturer: LINTEC Corporation, thickness: 38 µm) as a release layer 22 was stacked on the surface of the magnetic layer 10 where the convex-concave forming layer 20 was not present (i.e. a pattern transferring material 30 was not stacked on the side of the magnetic layer 10 where the convex-concave forming layer 20 was not present) as shown in FIG. 3A, and the matte processed PET (LUMIRROR×44 #25) used in Example 13 as the convex-concave forming layer 20 was replaced with PET (Emblet, manufactured by UNITIKA LTD.) having a thickness of 25 µm shown in Table 1.

EXAMPLE 15

Figure 4A:
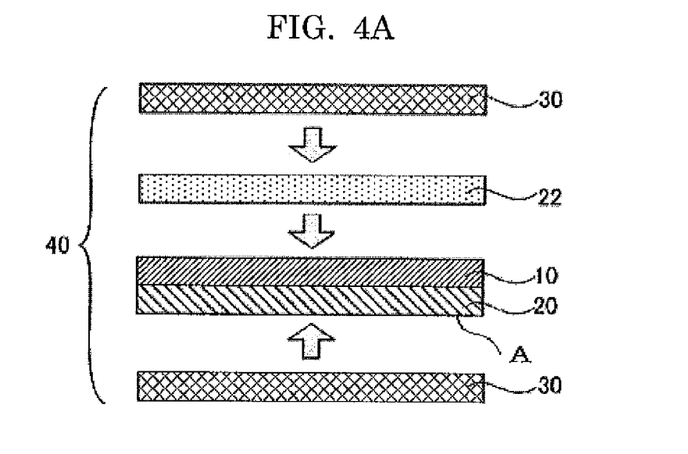
FIG. 4A is a process diagram (part 1) showing an example (Example 15) of the method for producing a magnetic sheet of the present invention.
Figure 4B:
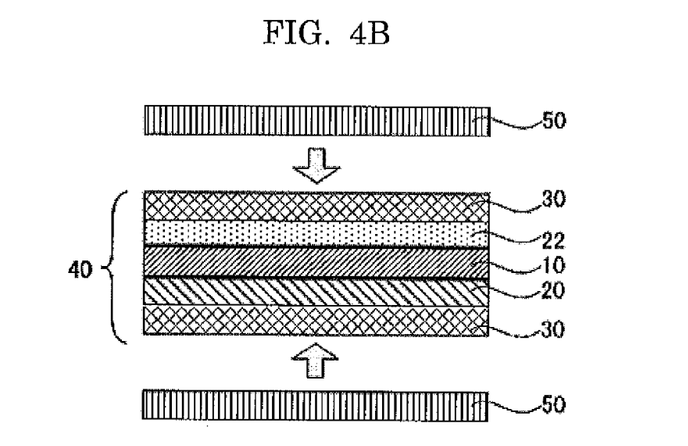
FIG. 4B is a process diagram (part 2) showing the example (Example 15) of the method for producing a magnetic sheet of the present invention.
Figure 4C:
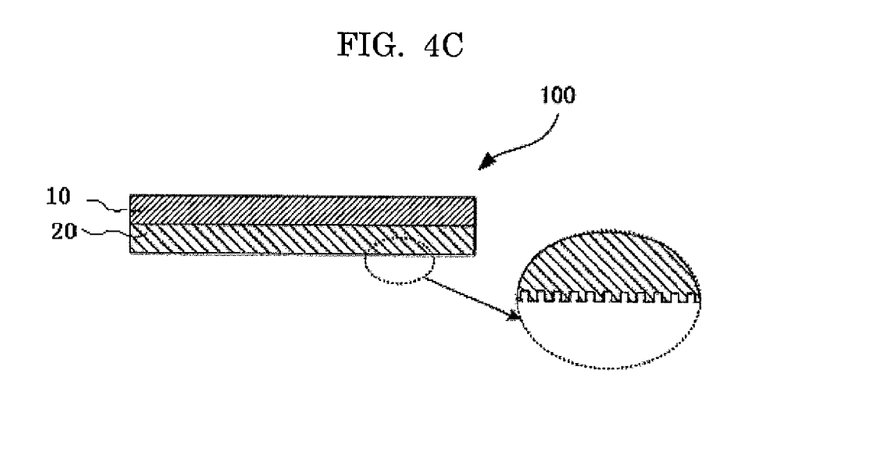
FIG. 4C is a process diagram (part 3) showing the example (Example 15) of the method for producing a magnetic sheet of the present invention, and illustrates an example of the obtained magnetic sheet (the present invention).

A magnetic sheet was prepared in the same manner as in Example 13, provided that the matte processed PET (LUMIRROR×44 #25) used in Example 13 as the convex-concave forming layer 20 was replaced with a silicone lubrication processed PET (25GS, manufactured by LINTEC Corporation) shown in Table 1. Here, the silicone lubrication processed PET (25GS, manufactured by LINTEC Corporation) as the convex-concave forming layer 20 was stacked in the manner that the lubrication processed surface thereof became the opposite plane (the plane A shown in FIG. 4A) to the plane present at the side of the magnetic layer 10.

COMPARATIVE EXAMPLE 1

—Preparation of Magnetic Sheet—

A magnetic layer was formed on the base (the release layer) in the same manner as in Example 1, and cured by pressing by means of a hot-press (KVHC—PRESS, manufactured by KITAGAWA SEIKI CO., LTD.) at a temperature of 170° C., pressure of 9 MPa for 10 minutes to thereby form a magnetic layer having a thickness of 65 µm.

Next, on the surface of the cured magnetic layer, an adhesive (No. 5601, manufactured by Nitto Denko Co., Ltd.) was applied so as to form an adhesive layer having a thickness of 10 µm, and then on this adhesive layer a polyester film a surface of which had been matte processed (matte processed PET; thickness: 25 µm) shown in Table 1 was laminated as the convex-concave forming layer.

Thereafter, the pattern transferring materials were respectively laminated on the convex-concave forming layer and the release layer in the same manner as in Example 1, the magnetic layer and the convex-concave forming layer were bonded via the adhesive layer using a hand roller (manufactured by Sony Chemical & Information Device Corporation). Then, the pattern transferring materials and the release layer were peeled, to thereby obtain a magnetic sheet having a thickness of 100 µm.

COMPARATIVE EXAMPLE 2

—Preparation of Magnetic Sheet—

A magnetic sheet was prepared in the same manner as in Comparative Example 1, provided that the matte processed PET used in Comparative Example 1 as the convex-concave forming layer was replaced with a polyester film which had not been lubrication processed shown in Table 1.

TABLE 1

| | Convex-concave forming layer | |
| --- | --- | --- |
| | Product Name and Manufacturer | Bekk smoothness before treatment (hot-pressing) (sec/mL) |
| Ex. 1 | Matte processed PET (LUMIRRORX X44-#25, Toray Industries, Inc.) | 101.8 |
| Ex. 2 | Matte processed PET (LUMIRRORX X44-#38, Toray Industries, Inc.) | 83.4 |
| Ex. 3 | 28 µm-thick PET without a lubrication processing (Emblet; UNITIKA LTD.) | More than 200 |
| Ex. 4 | Silicone lubrication processed PET ([FLUOROJU RL]; Mitsubishi Plastics, Inc.) | More than 200 |
| Ex. 5 | Silicone lubrication processed PET ([25GS]; LINTEC Corporation) | More than 200 |
| Ex. 6 | Matte processed PET (LUMIRRORX X44-#25, Toray Industries, Inc.) | 101.8 |
| Ex. 7 | Matte processed PET (LUMIRRORX X44-#25, Toray Industries, Inc.) | 101.8 |
| Ex. 8 | Matte processed PET (LUMIRRORX X44-#25, Toray Industries, Inc.) | 101.8 |
| Ex. 9 | Matte processed PET (LUMIRRORX X44-#25, Toray Industries, Inc.) | 101.8 |
| Ex. 10 | 25 µm-thick PET without a lubrication processing (Emblet, UNITIKA LTD.) | More than 200 |
| Ex. 11 | 12 µm-thick PET without a lubrication processing (Emblet, UNITIKA LTD.) | More than 200 |

TABLE 1-continued

| | Convex-concave forming layer | |
|---|---|---|
| | Product Name and Manufacturer | Bekk smoothness before treatment (hot-pressing) (sec/mL) |
| Ex. 12 | 4.5 μm-thick PET without a lubrication processing (XR30, Toray Saehan Inc.) | More than 200 |
| Ex. 13 | Matte processed PET (LUMIRRORX X44-#25, Toray Industries, Inc.) | 101.8 |
| Ex. 14 | 25 μm-thick PET without a lubrication processing (Emblet; UNITIKA LTD.) | More than 200 |
| Ex. 15 | Silicone lubrication processed PET ([25GS]; LINTEC Corporation) | More than 200 |
| Comp. Ex. 1 | Matte processed PET (LUMIRRORX X44-#25, Toray Industries, Inc.) | 101.8 |
| Comp. Ex. 2 | 25 μm-thick PET without a lubrication processing (Emblet; UNITIKA LTD.) | More than 200 |

The magnetic sheets obtained from Examples 1 to 15 and Comparative Examples 1 and 2 were each subjected to the measurement of Bekk smoothness at the surface of the convex-concave forming layer resulted from the convex-concave forming layer and the dynamic friction coefficient of the magnetic sheet in the following methods. The results are shown in Table 2.

[Bekk Smoothness]

Bekk smoothness of the surface of the convex-concave forming layer was measured by means of Bekk Smoothness Tester (manufactured by TESTER SANGYO CO., LTD.).

[Dynamic Friction Coefficient]

The dynamic friction coefficient of the magnetic sheet was measured by means of HEIDON friction wear testing machine (HEIDON-14, manufactured by SHINTO Scientific Co., Ltd.) under the following conditions.

At first, the magnetic sheet was placed on a stand of HEIDON friction wear testing machine, nylon and ABS were used as ASTM standard plane indenter, the ASTM standard plane indenter was set so as to be parallel to the magnetic sheet, and the value pa of the friction generated at the time when the magnetic sheet moved was measured. The results are shown in Table 2.

—Conditions for Measurement—

| | |
|---|---|
| Size of ABS | 50 mm × 50 mm |
| Size of nylon | 50 mm × 50 mm |
| Load | 200 kgf (weight 50 g) |
| Scanning speed | 150 mm/min |

TABLE 2

| | Convex-concave forming layer | | |
|---|---|---|---|
| | Bekk smoothness | Dynamic friction coefficient μa | |
| | (sec/mL) | Against ABS | Against nylon |
| Ex. 1 | 34.3 | 0.181 | 0.203 |
| Ex. 2 | 44.9 | 0.159 | 0.166 |
| Ex. 3 | 46.9 | 0.182 | 0.191 |
| Ex. 4 | 32.2 | 0.196 | 0.171 |
| Ex. 5 | 59.6 | 0.156 | 0.164 |
| Ex. 6 | 12.3 | 0.172 | 0.183 |
| Ex. 7 | 9.8 | 0.191 | 0.174 |
| Ex. 8 | 10.2 | 0.181 | 0.190 |
| Ex. 9 | 15.6 | 0.178 | 0.186 |
| Ex. 10 | 69.6 | 0.189 | 0.198 |
| Ex. 11 | 3.1 | 0.167 | 0.175 |
| Ex. 12 | 2.3 | 0.164 | 0.169 |
| Ex. 13 | 12.1 | 0.181 | 0.184 |
| Ex. 14 | 14.3 | 0.193 | 0.198 |
| Ex. 15 | 13.1 | 0.179 | 0.173 |
| Comp. Ex. 1 | 81.2 | 0.239 | 0.251 |
| Comp. Ex. 2 | More than 200 | 0.199 | 0.261 |

From the results shown in Table 2, it was found that the magnetic sheets of Examples 1 to 15 had lower Bekk smoothness and smaller dynamic friction coefficient compared to the magnetic sheets of Comparative Examples 1 and 2, and thus the magnetic sheets of Examples 1 to 15 had excellent lubricity (high surface roughness).

Moreover, in both Example 3 and Comparative Example 2, the PET film a surface of which had not been lubrication processed, which had high Bekk smoothness, was used, but the magnetic sheet of Example 3 which was produced in the method for producing a magnetic sheet of the present invention had low Bekk smoothness and small dynamic friction coefficient. According to this result, it was found that the method for producing a magnetic sheet of the present invention enabled to control Bekk smoothness of the convex-concave forming layer at the desirable degree regardless of Bekk smoothness of the original convex-concave forming layer, and thus a selection of the materials to be used as the convex-concave forming layer (convex-concave forming layer) could be widen and a magnetic sheet having excellent lubricity could be efficiently produced.

In Examples 6 to 15, the thickness of the magnetic layer was made thicker (100 μm to 500 μm) than the thickness thereof (75 μm) of Examples 1 to 5, using the shape transfer. From the results of Examples 6 to 9 and 11 to 15, it was found that by thickening the magnetic layer, Bekk smoothness thereof was lowered and as a result, a shape was more easily formed on the surface of the convex-concave forming layer. The reason that Bekk smoothness was lowered by thickening the magnetic layer was assumed that a surface stability or positioning stability of the sheet was improved by thickening the magnetic layer.

Note that, in Example 10, Bekk smoothness was increased (69.6 sec/mL) even though the thickness of the magnetic layer was made thicker (100 μm) than the thickness (75 μm) of the magnetic layer of Examples 1 to 5, and a shape was not easily formed on the surface of the convex-concave forming layer. The reason that Bekk smoothness was increased in Example 10 was assumed that the temperature for pressing was 150° C., which was low, and thus the melt viscosity of the magnetic layer was not decreased and the pattern transferring material could not be pressed in at the time of hot pressing.

Next, the magnetic sheets obtained from Example 1 and Comparative Example 1 were subjected to the measurement of magnetic permeability in the following method.

Note that, the magnetic sheet of Example 1 had the magnetic layer having a thickness of 75 μm, the convex-concave forming layer having a thickness of 25 μm (the total thickness of the magnetic layer was 100 μm), and specific gravity of 3.10.

The magnetic sheet of Comparative Example 1 had the magnetic layer having a thickness of 65 μm, the adhesive layer having a thickness of 10 μm, the convex-concave forming layer having a thickness of 25 μm (the total thickness of the magnetic layer was 100 μm), and specific gravity of 3.01.

[Magnetic Permeability]

At first, the magnetic sheet was cut into a ring shape having an outer diameter of 7.05 mm and inner diameter of 2.945 mm so as to prepare a ring convex-concave forming layer sample, and a conducting wire was winded around the ring convex-concave forming layer sample at 5 turns and was soldered to a terminal. Here, the length between the edge of the terminal and the ring convex-concave forming layer sample was 20 mm. Then, inductance and resistance were measured at a certain frequency by means of an impedance analyzer (4294A, manufactured by Agilent Technologies, Inc.), and the obtained values were converted into magnetic permeability.

Figure 5:
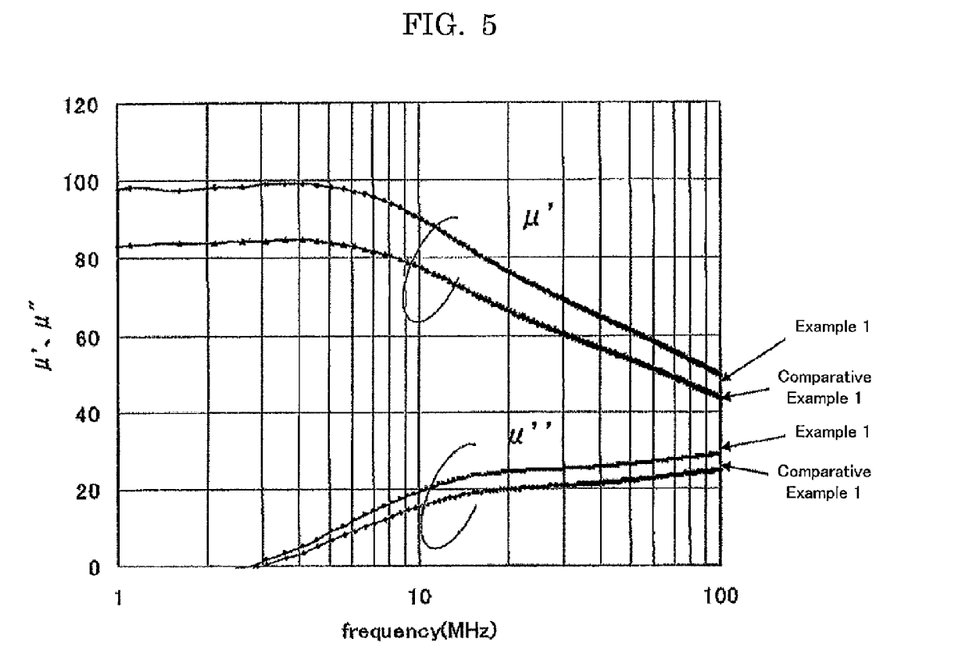
FIG. 5 is a graph showing a relationship between a frequency and magnetic permeability of magnetic sheets of Example 1 and Comparative Example 1.

FIG. 5 shows a relationship between the frequency and magnetic permeability of the magnetic sheets of Example 1 and Comparative Example 1. In FIG. 5, μ' and μ" respectively denote a real part and an imaginary part of the complex magnetic permeability.

The characteristics of μ' and μ" are different depending on the intended use of the magnetic sheet. For example, in the case where the magnetic sheet is used for inhibiting the electromagnetic interference, high values of μ' and μ" are preferable at the frequency is 1 MHz to 1 GHz, and in the case where the magnetic sheet is used for improving the transmission of the RFID device, a high value of μ' and a low value of μ" are preferable at the frequency of 20 MHz or less.

From the results shown in FIG. 5, it was found that the magnetic sheet of Example 1 had high magnetic permeability compared to the magnetic sheet of Comparative Example 1.

If the thickness of the magnetic layer is thin, the specific gravity becomes small and thus magnetic permeability becomes low. In accordance with the method for producing the magnetic sheet of Example 1, as it was not necessary to form an adhesive layer, the thickness of the magnetic layer could be increased by the thickness of the adhesive layer while maintaining the total thickness of the magnetic sheet. As a result, the specific gravity could be increased, and thus higher magnetic permeability could be obtained.

Moreover, the magnetic sheet was efficiently produced at low cost, as the adhesive layer was not formed.

The magnetic sheet of the present invention is suitably used for, for example, an electromagnetic noise depressor, an electromagnetic wave absorber, a magnetic shielding material, an electronic equipment having an IC tag function such as RFID (e.g. RFID functioned mobile phones) and non-contact IC card.

The method for producing a magnetic sheet of the present invention easily and efficiently produce a magnetic sheet which is excellent in a surface lubricity, and has high magnetic permeability, at low cost.

What is claimed is:

1. A method for producing a magnetic sheet, comprising:
    adding a magnetic powder to a resin composition so as to prepare a magnetic composition, and giving the magnetic composition a shape so as to form a magnetic layer; and
    placing and stacking a convex-concave forming layer and a pattern transferring material on a surface of the magnetic layer in this alignment order from the side of the magnetic layer, and
    hot pressing the stacked layers so as to bond the convex-concave forming layer with the magnetic layer to form a laminate, as well as to transfer a surface configuration of the pattern transferring material to a surface of the laminate of the convex-concave forming layer and the magnetic layer,
    wherein the resin composition comprises a thermoset resin, and the thermoset resin is uncured before the hot pressing.

2. The method for producing a magnetic sheet according to claim 1, wherein the placing and stacking further comprises stacking a release layer and a pattern transferring material on the other surface of the magnetic layer in this order from the side of the magnetic layer.

3. The method for producing a magnetic sheet according to claim 1, wherein the pattern transferring material has a convex-concave pattern on a surface thereof.

4. The method for producing a magnetic sheet according to claim 1, wherein a surface of the convex-concave forming layer is treated with a matte processing, or a lubrication processing without using a silicone resin.

5. The method for producing a magnetic sheet according to claim 1, wherein the convex-concave forming layer has Bekk smoothness of 200 sec/mL or less before the hot pressing.

6. The method for producing a magnetic sheet according to claim 1, wherein the convex-concave forming layer has Bekk smoothness of 70 sec/mL or less after the hot pressing.

7. The method for producing a magnetic sheet according to claim 1, further comprising removing the pattern transferring material from the laminate of the convex-concave forming layer and the magnetic layer.

* * * * *